(12) United States Patent
Nies

(10) Patent No.: US 6,309,767 B1
(45) Date of Patent: Oct. 30, 2001

(54) SUPERCONDUCTOR STRUCTURE WITH GLASS SUBSTRATE AND HIGH-TEMPERATURE SUPERCONDUCTOR DEPOSITED THEREON, CURRENT LIMITER DEVICE HAVING THE SUPERCONDUCTOR STRUCTURE AND PROCESS FOR PRODUCING THE STRUCTURE

(75) Inventor: Rainer Nies, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/563,393

(22) Filed: May 1, 2000

Related U.S. Application Data

(63) Continuation of application No. PCT/DE98/03116, filed on Oct. 23, 1998.

(30) Foreign Application Priority Data

Oct. 29, 1997 (DE) .............................. 197 47 767

(51) Int. Cl.$^7$ ................................... H01L 39/00
(52) U.S. Cl. ................... 428/930; 428/702; 428/699; 428/689; 505/238; 505/239
(58) Field of Search ................ 505/160, 237, 505/238, 239, 470, 471, 473, 474, 476, 700, 701, 730, 731, 732, 772, 818, 816, 819, 825, 856; 338/13, 20

(56) References Cited

U.S. PATENT DOCUMENTS

| | | |
|---|---|---|
| 5,204,289 | 4/1993 | Moh ......................................... 501/5 |
| 5,986,536 | 11/1999 | Ries et al. .............................. 338/13 |

FOREIGN PATENT DOCUMENTS

| | | |
|---|---|---|
| 0 312 015 A1 | 4/1989 | (EP) . |
| 0 523 374 A1 | 1/1993 | (EP) . |
| 1-244677 | 9/1989 | (JP) . |
| 2-27614 | 1/1990 | (JP) . |
| 3-3277 | 1/1991 | (JP) . |

OTHER PUBLICATIONS

Chen, K.Y, et al. "Fabrication of biaxially aligned YBa2Cu3O7–x thin films on glass substrates". 1996. Physica C 267 pp. 355–360 No month.*
Kinder, H, et al. "Double Sided YBCO Films on 4" Substrates by Thermal Reactive Evaporation". Jun. 1995. IEEE Trans on Appl Superconductivity, vol. 5, No. 2 pp. 1575–1580.*
Gromoll, B. et al. "Resistive Current Limiters with YBCO Films". Jun. 1997. IEEE Trans on Appl Superconductivity, vol. 7, No. 2 pp. 828–831.*
"Fabrication of biaxially aligned $YBa_2Cu_3O_{7-x}$ thin films on glass substrates", dated Apr. 22, 1996, Physica C, vol. 267, pp. 355–360, as mentioned on p. 2 of the specification.

(List continued on next page.)

*Primary Examiner*—Deborah Jones
(74) *Attorney, Agent, or Firm*—Herbert L. Lerner; Laurence A. Greenberg; Werner H. Stemer

(57) ABSTRACT

A superconductor structure inclludes a substrate made from a temperature-resistant glass material, a buffer layer which has been deposited on the substrate, and a layer of a metal oxide high $T_c$ superconductor material that has been deposited thereon. A glass material with a coefficient of thermal expansion of over $6 \cdot 10^{-6}$ $K^{-1}$ and a transformation temperature of over 550° C. is to be provided. At least a deposition process in which a maximum temperature is at most 100 K higher than the transformation temperature of the glass material is selected for the production of the structure. A current limiter device is also provided.

26 Claims, 1 Drawing Sheet

OTHER PUBLICATIONS

"Brockhaus Enzyklopädie in vierundzwanzig Bänden", Achter Band, Siemens AG Fachbibliothek.

"Vorgespanntes Glas BGG–11", Produktinformation, März 1993, pertains prestressed glass BGG–11; No month.

"Deutsche Norm DIN 4762 Oberflächenrauheit", dated 1984, pertains to the International Norm ISO 4287/1 concerning surface roughness; No month.

* cited by examiner

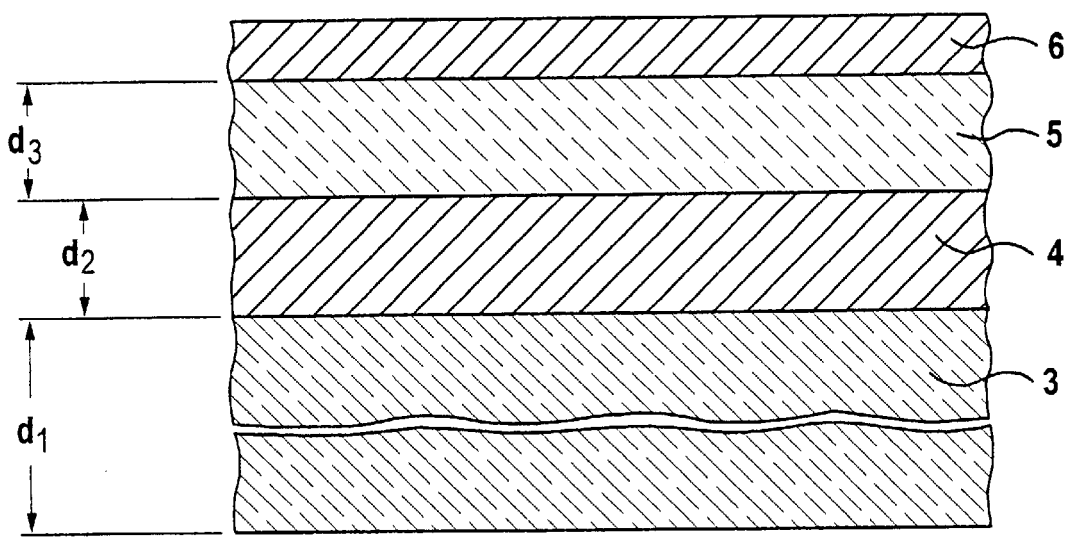
2

US 6,309,767 B1

SUPERCONDUCTOR STRUCTURE WITH GLASS SUBSTRATE AND HIGH-TEMPERATURE SUPERCONDUCTOR DEPOSITED THEREON, CURRENT LIMITER DEVICE HAVING THE SUPERCONDUCTOR STRUCTURE AND PROCESS FOR PRODUCING THE STRUCTURE

CROSS-REFERENCE TO RELATED APPLICATION

This application is a continuation of copending International Application No. PCT/DE98/03116, filed Oct. 23, 1998, which designated the United States.

BACKGROUND OF THE INVENTION

FIELD OF THE INVENTION

The invention relates to a superconductor structure having a substrate, at least one buffer layer which has been deposited on the substrate, and a layer of a metal oxide superconductor material with a high critical temperature which has been deposited on the buffer layer, the substrate including a glass material which is sufficiently temperature-resistant to be able to withstand the maximum temperature during production of the buffer layer and the superconductor layer. The invention also relates to a current limiter device and a process for producing a corresponding superconductor structure. A structure and a corresponding production process of this general type can be found in "Physica C", Vol. 267, 1996, pages 355 to 360.

Superconductive metal oxide compounds with high critical temperatures $T_c$ of over 77 K are known, and these compounds are therefore also known as high $T_c$ superconductor materials or HTS materials and, in particular, enable an $LN_2$ (liquid nitrogen) cooling technique to be used. Such metal oxide compounds include, in particular, cuprates of special material systems, for example of the Y—Ba—Cu—O or Bi—Sr—Ca—Cu—O types, in which the Bi component can be partially substituted by Pb. There can be a plurality of superconductive high $T_c$ phases within individual material systems, which phases differ through the number of copper-oxygen lattice planes or layers within the crystalline unit cell and have different critical temperatures.

It is desired for these known HTS materials to be deposited on different substrates for different applications, the aim generally being to form pure-phase superconductor material as far as possible. For example, metallic substrates are provided in particular for conductor applications. Furthermore, DE 195 20 205 A describes the general use of substrates made from glass material as supports for conductor tracks made from HTS material in current limiter devices. In order to allow textured growth of the HTS material, it is also known for a suitable buffer layer to be applied to that surface of the substrate which is to be coated with the HTS material.

The production of a biaxially oriented thin film made from the HTS material $YBa_2Cu_3O_{7-x}$ on various glass substrates is described in the literature reference from "Physica C" which was mentioned in the introduction. Materials with a coefficient of expansion α of at most $4.6 \times 10^{-6}$ °C.$^{-1}$ were used for the glass substrate used in that document. These materials are so-called "hard glass", since glass materials with α values of below $6 \times 10^{-6}$/K are generally referred to in this way, while glass materials with a α value above this are referred to as "soft glasses" (see H. G. Pfaender: "Schott-Glaslexikon", 1984, page 30). Moreover, the substrates of the known structure had a very small surface area to be coated, which was covered with oriented, Y-stabilized $ZrO_2$. However, it has emerged that with the known structure it is only possible to achieve critical current densities $J_c$ of the order of magnitude of $10^4$ A/cm$^2$ (in the zero field). Current densities of this level are regarded as being too low for many applications.

SUMMARY OF THE INVENTION

It is accordingly an object of the invention to provide a superconductor structure with a glass substrate and a high-temperature superconductor deposited thereon, a current limiter device having the superconductor structure and a process for producing the structure, that overcome the above-mentioned disadvantages of the prior art devices and processes of this general type, in such a way that comparatively higher critical current densities can be achieved and industrial manufacture using commercially available, large-area, cost-effective glass materials is made possible.

With the foregoing and other objects in view there is provided, according to the invention, a superconductor structure, comprising a substrate, at least one buffer layer deposited on the substrate, and a layer of a metal oxide superconductor material with a high critical temperature deposited on the buffer layer, wherein the substrate is formed of a glass material which is sufficiently temperature-resistant to be able to withstand the maximum temperature during the production of the buffer layer and the superconductor layer, has a coefficient of thermal expansion which is greater than $6 \times 10^{-6}$ K$^{-1}$, and has a transformation temperature of over 550° C.

The invention is based on the recognition that the (linear) thermal expansion coefficient of the glass material, which is to be regarded as "soft glass", together in combination with the transformation temperature, which is of importance with regard to the maximum temperature required for the deposition or formation of the superconductor material, is the decisive variable with a view to obtaining a high critical current density $J_c$. If a glass material having the claimed levels of expansion coefficient and transformation temperature is selected, it is advantageously possible to at least substantially avoid cracking in the HTS material, a phenomenon which was observed in the known superconductor structure described in the above-mentioned literature reference "Physica C", since the claimed value of the coefficient of expansion is at least substantially matched to that of the HTS material, which is of the order of magnitude of $10 \times 10^{-6}$ K$^{-1}$. A glass material with a coefficient of expansion of over $7 \times 10^{-6}$ K$^{-1}$ is therefore to be considered particularly advantageous. The measurement range for the above-mentioned values of the coefficients of expansion usually extends from 20° C. to 300° C.

Surprisingly, it has been found that commercial glass materials intended for applications in other specialist fields, such as for example in the field of safety glasses, with a sufficiently large surface area are available and, despite having a sufficiently high transformation temperature of over 550° C., preferably of at least 580° C., have the required high coefficient of expansion. In fact, the materials properties of commercially available glass materials with high coefficients of expansion mean that these materials generally do not have the required resistance to high temperatures such as those which are needed for the production of HTS materials. These problems arise, for example, in the case of known commercially available soda-lime glass materials, since the transformation temperatures of these materials are generally below 550° C.

Glass materials according to the invention which are suitable as the substrate material are relatively inexpensive, so that they can be used in particular for large-area substrates with a coatable area of at last 10 cm², preferably over 100 cm², as are to be provided in particular for current limiter devices. Specifically, in such devices a total surface area of HTS material of over 2 m² is required for a power of, for example, approximately 10 MVA which is to be limited.

Advantageously, a flat glass which has been produced in particular through the use of a drawing process is provided with a view to obtaining an inexpensive, large-area glass material.

If a thermally smoothed flat glass is used, the conditions for the deposition of a high-quality buffer layer which promotes the formation of a superconductor layer with a high critical current density are particularly good.

Advantageously, the glass materials selected may be special aluminosilicate glasses, since they are best able to satisfy the required combination of glass properties. Such a glass material preferably contains approximately 50 to 70% by weight $SiO_2$ and approximately 10 to 30% by weight $Al_2O_3$, it being possible for the above-mentioned values to deviate by ±5%.

Furthermore, the glass material used advantageously contains cerium, in particular in the form of a cerium oxide addition. This is because such an addition enables the transformation temperature of the glass material to be increased to a certain extent.

Advantageously for the production of a corresponding structure, at least a deposition process in which the maximum temperature on the substrate is at most 100 K higher, preferably at most 50 K higher, than the transformation temperature of the glass material is selected for the material of the buffer layer and/or the superconductor layer. In this way, it is advantageously possible to ensure dimensional stability, in particular of large-area substrates.

Further advantageous configurations of the structure according to the invention and of the process for its production are given in the dependent claims.

Other features which are considered as characteristic for the invention are set forth in the appended claims.

Although the invention is illustrated and described herein as embodied in a superconductor structure with a glass substrate and a high-temperature superconductor deposited thereon, a current limiter device having the superconductor structure and a process for producing the structure, it is nevertheless not intended to be limited to the details shown, since various modifications and structural changes may be made therein without making a departure from the spirit of the invention and which is within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a fragmentary, diagrammatic, cross-sectional view of a superconductor structure according to the invention.

DESCRIPTION OF THE PREFERRED EMBODIMENTS

Referring now in detail to the single FIGURE of the drawing, it is seen that a superconductor structure according to the invention can particularly advantageously be provided for devices in which large-area substrate surfaces of preferably at least 10 cm², in particular over 100 cm², are used as a substrate for HTS material. One example of such a device is a short-circuit current limiter device with a planar conductor configuration, the basic structure of which is generally known (see for example the above-mentioned U.S. Pat. No. 5,988,536). Current limiter devices of this nature in fact require substrate surfaces of up to over 2000 cm². The use of special glass materials as large-area substrates then enables the corresponding superconductor structure to be produced at relatively low cost.

Part of a cross section through a conductor structure of such a short-circuit current limiter device can be seen in the FIGURE. The structure, which is denoted overall by 2, includes a substrate 3 and at least one buffer layer 4 which has been applied thereto. A layer 5 made from an HTS material, which if appropriate can be structured, has been deposited on the buffer layer. The HTS layer 5 can be covered with at least one further layer, such as, for example, a protective layer or a layer 6 which serves as a shunt resistor. A shunt resistor layer is particularly advantageous for current limiter applications.

A plate with a thickness $d_1$ of a few millimeters and with the required surface area, made from a special flat glass, which has preferably been drawn from the melt and, if appropriate, has subsequently undergone thermal planarization, is used as substrate. During the thermal planarization, small undulations and other unevenness are smoothed out through the use of the surface being heated. The fused surface then exhibits a microroughness which is sufficiently small for the subsequent coating operations. The surface roughness, defined by the maximum surface roughness $R_t$, should advantageously be below 50 nm, preferably below 20 nm, based on a measurement section of 500 µm. In the present context, the variable $R_t$ is understood as meaning the distance within the intended section which is produced between an upper limit line which touches the surface profile at its highest elevation and a parallel lower limit line which touches the surface profile at its lowest valley (see also 1978 draft of DIN 4762). Greater undulation of the surface in the millimeter range does not generally present problems.

According to the invention, the material selected for the substrate should be a glass material which, on the one hand, has a sufficiently high transformation temperature of at least 550° C., preferably of at least 580° C., with regard to the maximum temperature (on the substrate) occurring in the subsequent deposition processes. The transformation temperature should be at most 100° C. below this maximum temperature of the process. The temperature of the deposition process lies between the transformation temperature and the deformation temperature of the glass material. It is advantageous to select a deposition temperature which is at least 100° C. below the deformation temperature. On the other hand, the glass material should have a linear thermal expansion coefficient α in a standard temperature range between 20° and 300° C. which is greater than $6 \times 10^{-6}$ K$^{-1}$ and in particular is above $7 \times 10^{-6}$ K$^{-1}$. Surprisingly, these requirements are fulfilled by aluminosilicate glass materials, which in particular contain about 50 to 70% by weight $SiO_2$ and 10 to 30% by weight $Al_2O_3$, in addition to further components. A suitable aluminosilicate glass is a glass produced by "Deutsche Spezialglas AG", Grünplan (DE), under the product name "SG-11" (previous product name "BGG-11" produced by "Schott Glaswerke", Mainz (DE), 1983). This glass, which belongs to the safety glass category and is used, for example, in the aerospace and aeronautics industries, in the lighting and window industry and for spectacles and watch glass materials and for substrates for photomasks, has a coefficient of thermal expansion α of $8.9 \times 10^{-6}$ $K^{-1}$ with a deformation temperature of 870° C. and a transformation temperature of 607° C. It has been recognized that this glass material can be used to particularly good effect as a large-area substrate material for HTS layers, in particular for current limiter devices.

Furthermore, glass materials which are known per se and are available as flat glass and which, although they have the required coefficient of thermal expansion, have a transformation temperature which is too low, are also suitable as starting materials. In this case, the transformation temperature can be increased to the required level by an addition of cerium in the form of $CeO_2$ in an amount of between 0.5 and 40% by weight, in particular between 1 and 30% by weight, to the known material, such as for example an aluminosilicate.

In order to enable the required textured, in particular epitaxial growth of the HTS material, which is required for a sufficiently high critical current density $J_c$ of the HTS material of, for example at least $10^4$ $A/cm^2$, the at least one buffer layer must be formed of a material which ensures such growth. Therefore, a layer 4 with a texture which is matched to the crystalline dimensions of the HTS material is particularly suitable. Biaxially textured, yttrium-stabilized zirconium oxide (abbreviation: "YSZ") is advantageous. In addition, other known buffer layer materials, such as for example $CeO_2$, $YSZ+CeO_2$ (as a double layer), $Pr_6O_{11}$, MgO, YSZ+tin-doped $In_2O_3$ (as a double layer), $SrTiO_3$ or $La_{1-x}Ca_xMnO_3$, are also suitable. One or more of these materials is deposited in a manner known per se on the surface of the substrate 3. For this purpose it is advantageous to use a so-called IBAD (Ion Beam Assisted Deposition) process. Naturally, other processes are also suitable, such as sputtering or laser ablation at a predetermined angle. The layer thickness $d_2$ of the textured buffer layer 4 produced in this way is generally between 0.05 and 2 $\mu$m.

Then, the HTS material is applied to the buffer layer 4 with the aid of known deposition processes, with the substrate being heated, in a thickness $d_3$ of generally up to a few micrometers. The minimum thickness of $d_3$, with a view to use in a current limiter device, is expediently at least 0.2 $\mu$m, in particular at least 0.5 $\mu$m. For this application, maximum thicknesses of $d_3$ of 5 $\mu$m, preferably of at most 3 $\mu$m, are generally sufficient. Advantageously, the process selected for deposition of the HTS material requires a maximum temperature for deposition and formation of the HTS material which is at most 100° higher, preferably at most 50° C. higher, than the required transformation temperature of the glass material selected. Moreover, the deposition or formation temperature should be at least 100° C. lower than the deformation temperature of the glass material. The most common processes using the PVD (Physical Vapor Deposition) technique are laser ablation using pulsed lasers, magnetron sputtering or preferably thermal codeposition (=simultaneous vapor deposition of the individual components of the HTS material while oxygen is being supplied). The latter process can advantageously be carried out at relatively low substrate temperatures of approximately 650° C. CVD (Chemical Vapor Deposition) processes, in particular using organometallic starting materials, are also suitable.

Suitable HTS materials are all known metal oxide high $T_c$ superconductor materials, such as in particular $YBa_2Cu_3O_{7-x}$ or $RBa_2CU_3O_{7-x}$ (where R=rare earth, including La), $TlBa_2Ca_2Cu_3O_{9-x}$, $HgBa_2CaCu_2O_{6+x}$, $Bi_2Sr_2CaCu_2O_{8-x}$ or $(Bi,Pb)_2Cr_2Ca_2Cu_3O_{11-x}$.

According to one concrete exemplary embodiment for the production of a plate conductor for a current limiter device using a superconductor structure 2 according to the invention, a glass substrate 3 made from the known aluminosilicate glass with the product name "SG-11", having a thickness $d_1$ of approximately 2 mm and a surface area of 10·10 $cm^2$ was selected. Next, a biaxially textured buffer layer 4 made from YSZ with a thickness $d_2$ of approximately 1 $\mu$m was applied to the smooth surface through the use of an IBAD process. Then, an HTS layer 5 made from $YBA_2Cu_3O_{7-x}$ with a thickness $d_3$ of approximately 1 $\mu$m was deposited on the substrate surface which had been coated in this way. A thermal codeposition of the components of the material while oxygen was being supplied, at a substrate temperature of 620° to 650° C., through the use of a known coating apparatus was used for this purpose. Subsequently, the HTS layer 5 was coated with an Au shunt resistor layer 6 with a thickness of 0.5 mm. The HTS layer of the structure 2 then had a critical current density $J_c$ (in the zero field, at 77 K, with 0.1 $\mu$V/cm as characteristic of the critical current $I_c$) of over $5 \times 10^5$ $A/cm^2$.

In the embodiments explained above, it has been assumed that the superconductor material is to be situated on only one side of the substrate. Naturally, double-sided coating is also possible. Such an embodiment is particularly advantageous in particular with a view to minimizing mechanical stresses in the substrate.

What is claimed is:

1. A superconductor structure, comprising a substrate, at least one buffer layer deposited on said substrate, and a layer of a metal oxide superconductor material with a high critical temperature deposited on said buffer layer, said substrate formed of a flat glass material sufficiently temperature-resistant to withstand a maximum temperature during production of said buffer layer and said superconductor layer, and said glass material having a coefficient of thermal expansion greater than $6 \times 10^{-6}$ $K^{-1}$ and a transformation temperature of over 550° C.

2. The superconductor structure according to claim 1, wherein said glass material has a transformation temperature at least 580° C.

3. The superconductor structure according to claim 1, wherein said glass material with a coefficient of thermal expansion of over $7 \times 10^{-6}$ $K^{-1}$.

4. The superconductor structure according to claim 1, wherein said flat glass is produced by a drawing process.

5. The superconductor structure according to claim 1, wherein said flat glass is thermally smoothed.

6. The superconductor structure according to claim 1, wherein said substrate is formed of an aluminosilicate glass.

7. The superconductor structure according to claim 6, wherein said aluminosilicate glass contains 50 to 70% by weight $SiO_2$ and 10 to 30% by weight $Al_2O_3$.

8. The superconductor structure according to claim 1, wherein said substrate is formed of a glass material additionally containing cerium.

9. The superconductor structure according to claim 8, wherein said glass material contains from 0.5 to 40% by weight of cerium oxide.

10. The superconductor structure according to claim 8, wherein said glass material contains from 1 to 30% by weight of cerium oxide.

11. The superconductor structure according to claim 1, wherein said substrate has a coatable surface area of at least 10 $cm^2$.

12. The superconductor structure according to claim 1, wherein said substrate has a coatable surface area of at least 100 $cm^2$.

13. The superconductor structure according to claim 1, wherein said at least one buffer layer has a texture adapted to crystalline dimensions of said superconductor material.

14. The superconductor structure according to claim 1, wherein said at least one buffer layer is formed of biaxially textured, yttrium-stabilized zirconium oxide.

15. A current limiter device, comprising a superconductor structure according to claim 1.

16. The superconductor structure according to claim 1, wherein said layer of said superconductor material has a thickness of at least 200 nm.

17. The superconductor structure according to claim 1, wherein said layer of said superconductor material has a thickness of at least 500 nm.

18. The superconductor structure according to claim 1, wherein said layer of said superconductor material has a thickness of at most 5 $\mu$m.

19. The superconductor structure according to claim 1, wherein said layer of said superconductor material has a thickness of at most 3 $\mu$m.

20. The superconductor structure according to claim 1, including a configuration of layers on both sides of said substrate.

21. A process for producing a superconductor structure according to claim 1, which comprises the steps of:
provided said glass material being sufficiently temperature-resistant to withstand the maximum temperature during production of said buffer layer and said superconductor layer, having a coefficient of thermal expansion greater than $6 \times 10^{-6}$ $K^{-1}$ and having a transformation temperature of over 550° C.;
depositing said at least one buffer layer thereon;
depositing said layer of superconducting material on said at least one buffer layer; and
holding a maximum temperature at said substrate, in at least one deposition process for a material of at least one of said at least one buffer layer and said superconductor layer, at most 100 K higher than a transformation temperature of said glass material.

22. The process according to claim 21, which further comprises holding the maximum temperature at said substrate at most 50 K higher than the transformation temperature of said glass material.

23. The process according to claim 21, which further comprises selecting the deposition process for said superconductor material from the group consisting of a simultaneous thermal vapor deposition of individual components of said superconductor material while supplying oxygen, a laser ablation process, a sputtering process and a chemical vapor deposition process with organometallic components of said superconductor material.

24. The process according to claim 21, which further comprises providing a screen-printing process for deposition of said superconductor material.

25. The process according to claim 21, which further comprises selecting the deposition process for a buffer layer material from the group consisting of an ion beam assisted deposition process, a sputtering process and a laser ablation.

26. A superconductor structure, comprising a substrate, at least one buffer layer deposited on said substrate, and a layer of a metal oxide superconductor material with a high critical temperature deposited on said buffer layer, said substrate formed of an aluminosilicate glass sufficiently temperature-resistant to withstand a maximum temperature during production of said buffer layer and said superconductor layer, and said glass containing 50 to 70% by weight $SiO_2$ and 10 to 30% by weight $Al_2O_3$, and having a coefficient of thermal expansion greater than $6 \times 10^{-6}$ $K^{-1}$ and a transformation temperature of over 550° C.

* * * * *